United States Patent [19]

Krause

[11] 4,316,154

[45] Feb. 16, 1982

[54] AUTOMATIC SWEEP AND ACQUISITION CIRCUIT FOR A PHASE LOCKED LOOP

[75] Inventor: Irving A. Krause, Nutley, N.J.

[73] Assignee: International Telephone and Telegraph Corporation, New York, N.Y.

[21] Appl. No.: 137,882

[22] Filed: Apr. 7, 1980

[51] Int. Cl.³ .............................................. H03L 7/00
[52] U.S. Cl. ................................. 331/4; 331/DIG. 2
[58] Field of Search ...................... 331/4, DIG. 2, 178

[56] References Cited

U.S. PATENT DOCUMENTS 4,131,862 12/1978 Black et al. ............................. 331/4
4,135,165 1/1979 Coe ........................... 331/DIG. 2 X
4,262,264 4/1981 Vandegraaf .............................. 331/4

OTHER PUBLICATIONS

Blanchard, Phase-Locked Loops, A Wiley-Interscience Publication, 1976, pp. 280-289.

Primary Examiner—Stanley T. Krawczewicz
Attorney, Agent, or Firm—John T. O'Halloran; Alfred C. Hill

[57] ABSTRACT

The automatic sweep and acquisition circuit for a phase locked loop includes a first circuit to detect when the error signal into the voltage controlled oscillator of an unlocked phase locked loop drifts to a DC voltage of a predetermined magnitude which represents an out-of-lock condition for the loop and this detected predetermined value is used to start the sweep waveform so as to regain a locked condition. Simultaneously with the start of the sweep waveform a dither tone is introduced into the loop filter which will not be fed back into the loop filter until the loop is locked. This fed back tone is detected and used to turn off or disconnect the sweep voltage and the dither tone.

41 Claims, 3 Drawing Figures

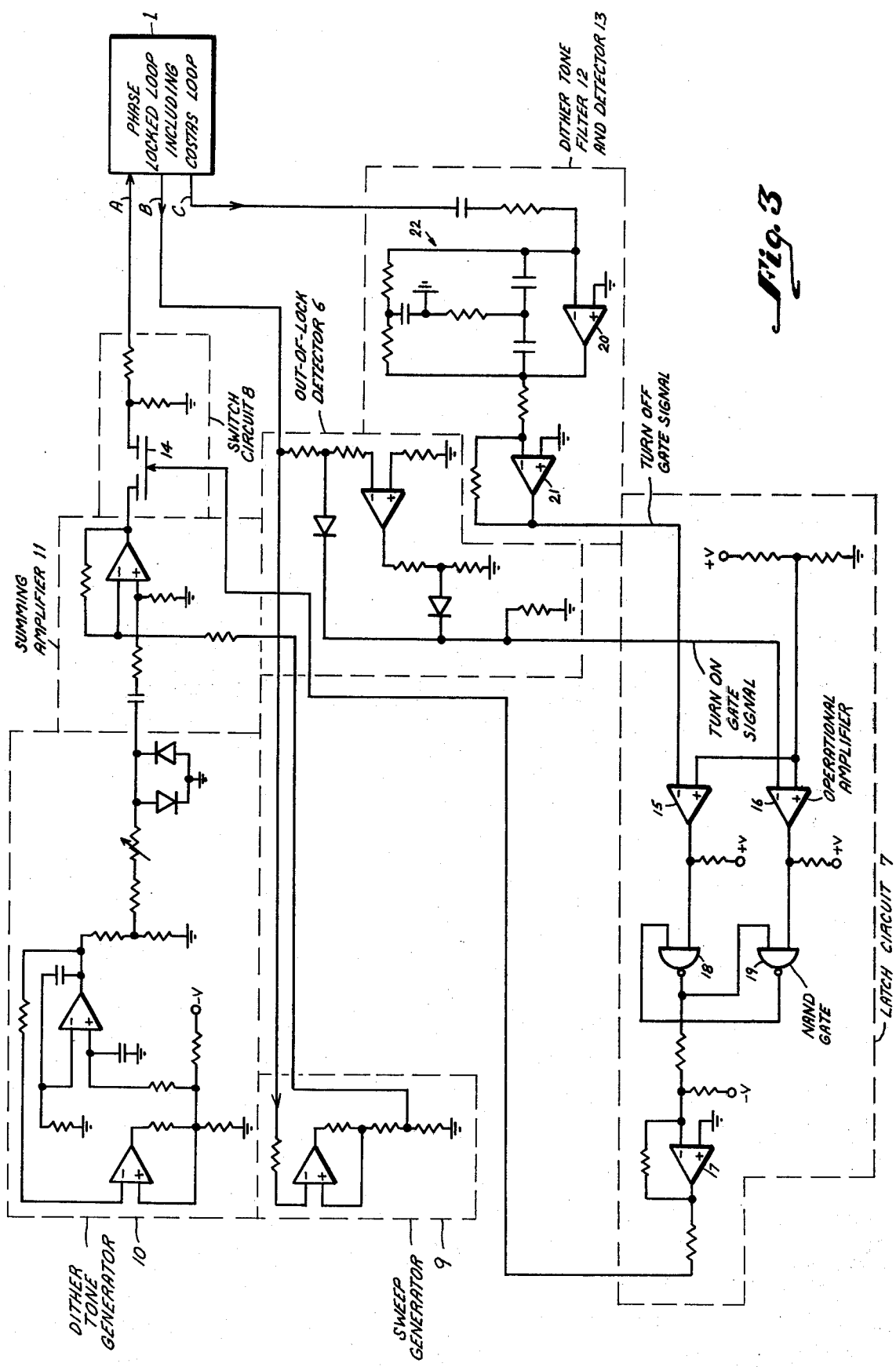

AUTOMATIC SWEEP AND ACQUISITION CIRCUIT FOR A PHASE LOCKED LOOP

BACKGROUND OF THE INVENTION

This invention relates to phase locked loops and more particularly to an automatic sweep and acquisition circuit for such phase lock loops.

In the past, receivers for frequency modulation, for bi-phase phase shift keyed modulation, or for tracking, usually employed a quadrature channel for producing an error signal and an in-phased channel for determining a locked condition or vice versa.

With regard to a Costas phase locked loop, the bandwidth of the loop was 8 kHz or less, while the frequency uncertainty of the translation oscillators in the radio equipment handling the signal was greater than this bandwidth. The major problem encountered was to sense when to turn on the sweep circuit and when to turn it off, since in the case of the Costas loop demodulator, there is no essential difference between the in-phase channel and the quadrature channels and no obvious way to use them to determine in or out of locked condition for the phase locked loop.

SUMMARY OF THE INVENTION

An object of the present invention is to provide an automatic sweep and acquisition circuit for a phase locked loop that does not rely on the ability to provide quadrature channel for producing an error signal and for determining a locked condition.

Another object of the present invention is to provide an automatic sweep and acquisition circuit for a phase locked loop that is an improvement over the automatic sweep and acquisition circuits found in the prior art.

A feature of the present invention is the provision of an automatic sweep and acquisition circuit for a phase locked loop comprising: first means coupled to the loop to detect an out-of-lock condition of the loop; second means couples to the loop and the first means responsive to the out-of-lock condition to inject a sweep voltage and a tone simultaneously into the loop; and third means coupled to the loop and the second means to detect the tone indicating a locked condition of the loop and to disconnect the second means from the loop when the tone is detected.

The automatic sweep and acquisition circuit for a phase locked loop in accordance with the principles of the present invention takes advantage of two unique properties of any phase locked loop. The first of these properties is that the error signal into the voltage controlled oscillator of an unlocked phase locked loop drifts off to a DC (direct current) voltage maximum or minimum depending upon the direction of any minute DC unbalance in the loop. A circuit to detect this maximum or minimum DC voltage at some predetermined level can be used to start the sweep waveforms when this predetermined value is reached. The second unique property is that a dither tone or just a plain tone introduced into the loop filter will not be fed back into the loop filter until the loop is locked. Injection of this tone into the loop filter at the time of starting the sweep will be detected by a circuit at the output of the phase detector of the loop when the loop is locked. Detection of this tone can then be used to turn off or disconnect the sweep voltage and dither tone.

BRIEF DESCRIPTION OF THE DRAWING

Above-mentioned and other features and objects of this invention will become more apparent by reference to the following description taken in conjunction with the accompanying drawing, in which:

FIG. 3 is a schematic diagram of the circuit of FIG. 1.

DESCRIPTION OF THE PREFERRED EMBODIMENT

Figure 1:
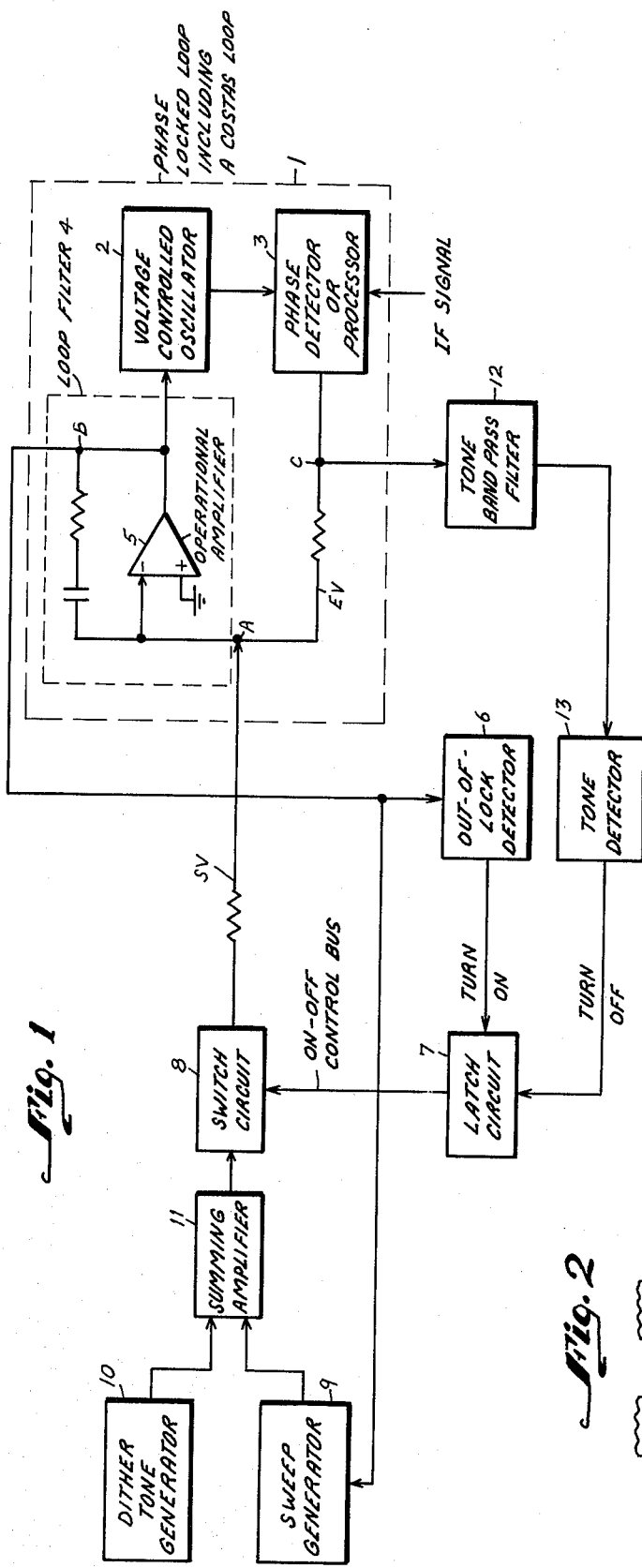
FIG. 1 is a block diagram of the automatic sweep and acquisition circuit for a phase locked loop in accordance with the principles of the present invention.

Referring to FIG. 1, there is illustrated therein in block diagram form a phase locked loop including a Costas loop identified by reference character 1 with which the automatic sweep and acquisition circuit of the present invention may be employed. It should be noted that the phase locked loop 1 is only an example of a phase locked loop that may employ the sweep and acquisition circuit of the present invention and this circuit may be employed with other type of phase lock loops. The phase locked loop i includes a voltage controlled oscillator 2 which may be a crystal controlled oscillator or other type of oscillator capable of being voltage controlled. The output of oscillator 2 is coupled to a phase detector or processor 3 to which an IF (Intermediate frequency) signal is applied to the other input. The phase detector 3 provides an output which is an error signal representing the phase difference between the two signals applied to its two inputs. This error signal EV is coupled to the loop filter 4 which includes an operational amplifier 5 having its non-inverting input grounded and its inverting input coupled to the output of the detector 3.

Assuming that loop 1 is not locked (or that there is no IF signal applied), the voltage at point B will drift toward a voltage maximum or minimum. When a predetermined limit is reached as detected by the out-of-lock detector or limit sensor 6, for example, the predetermined limit may be plus or minus 5 volts), the latch circuit 7 will be flipped to the on position which closes switch circuit 8. This connects the sweep voltage and dither tone generated in generators 9 and 10, respectively, and combined in summing amplifier 11 into the input of the loop filter 4. This signal is summed by operational amplifier 5 in loop filter 4 with any error signal produced by the detector 3.

Assume that an IF signal is applied and the phase locked loop 1 is out-of-lock and that the sweep voltage and tone generator are applied to the input of filter 4. When the sweep voltage sweeps the voltage controlled oscillator 2 through the IF signal, an error voltage is produced by phase detector 3. Since this error voltage is summed with the sweep voltage (or really its derivative), the error voltage overrides the sweep voltage and a lock of the loop is obtained. This is achieved by making the sweep current into the loop operational amplifier 5 less than the maximum error current in the amplifier 5. All that is required is that the sweep voltage SV and the error voltage EV be properly chosen.

Now that a lock has been established in loop 1, the dither tone appears at point C. This dither tone is filtered by tone bandpass filter 12 and applied to tone detector 13 which provides an output therefrom when the dither tone is present which flips latch circuit 7 to its off position. The output of latch circuit 7 open switch circuit 8 and loop 1 remains in lock. But the loop stress introduced by the sweep voltage and dither tone are now removed. Thus, the phase error between the voltage controlled oscillator and the received signal is minimized so that the performance of the loop returns to that of an unswept loop.

Figure 2:
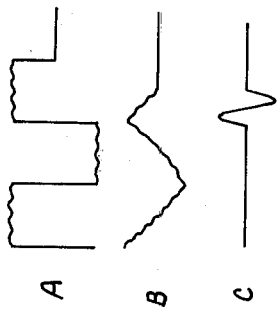
FIG. 2 illustrates a set of curves occurring at indicated points in FIG. 1.

The waveforms appearing at points A, B and C of FIG. 1 as well as FIG. 3 are shown in FIG. 2.

The foregoing in general describes the operation of the automatic sweep and acquisition circuit of this invention. A few words should be said about sweep generator 9 which is truly only part of a sweep generator. The loop filter 4 itself is used in conjunction with the circuit of sweep generator 9 to form a triangular waveform. This technique is the same as a triangular wave function generator type circuit.

A working model was built and tested and a schematic thereof is shown in FIG. 3. As can be seen from the schematic diagram of FIG. 3, operational amplifiers are used exclusively throughout which are obtainable as off-the-shelf items from various manufacturers, such as Texas Instrument and Motorola. Switching circuit 8 includes a switching transistor 14 and also obtainable as off-the-shelf items from the above-identified manufacturers. Latch circuit 7 includes operational amplifiers 15, 16 and 17 and nand gates 18 and 19 in the circuit configuration illustrated. Dither tone filter 12 and detector 13 includes operational amplifiers 20 and 21 and the bandpass filter 22 interconnected as illustrated.

The phase locked loop 1 as mentioned above is a Costas quadraphase loop, but it is to be noted that the automatic sweep and acquisition circuit of the present invention may be employed with any type of phase locked loop.

While I have described above the principles of my invention in connection with specific apparatus it is to be clearly understood that this description is made only by way of example and not as a limitation to the scope of my invention as setforth in the objects thereof and in the accompanying claims.

I claim

1. An automatic sweep and acquisition circuit for a phase locked loop comprising:
    first means coupled to said loop to detect an out-of-lock condition of said loop;
    second means coupled to said loop and said first means responsive to said out-of-lock condition to inject a sweep voltage and a tone simultaneously into said loop; and
    third means coupled to said loop and said second means to detect said tone indicating a locked condition of said loop and to disconnect said second means from said loop when said tone is detected.

2. A circuit according to claim 1, wherein said first means includes
    a fourth means to detect when the error signal in said loop achieves a predetermined direct current value.

3. A circuit according to claim 2, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and said loop, and
    a latch circuit coupled between said fourth and third means and said switch circuit to control said switch circuit in response to said out-of-lock condition and said locked condition.

4. A circuit according to claim 3, wherein said tone generator provides a dither tone.

5. A circuit according to claim 3, wherein said switch circuit includes
    a transistor switch. v 6. A circuit according to claim 3, wherein said third means includes
    a bandpass filter and a tone detector coupled in between said loop and said latch circuit.

7. A circuit according to claim 1, wherein said tone is a dither tone.

8. A circuit according to claim 1, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and said loop, and
    a latch circuit coupled between said first and third means and said switch circuit to control said switch circuit in response to said out-of-lock condition and said locked condition.

9. A circuit according to claim 8, wherein said tone generator provides a dither tone.

10. A circuit according to claim 8, wherein said switch circuit includes
    a transistor switch.

11. A circuit according to claim 8, wherein said third means includes
    a bandpass filter and a tone detector coupled in between said loop and said latch circuit.

12. A circuit according to claim 1, wherein said third means includes
    a bandpass filter and a tone detector coupled in tandem between said loop and said second means.

13. A circuit according to claim 1, wherein said loop includes
    a voltage controlled oscillator,
    a phase detecting means coupled to said oscillator and an input for an intermediate frequency signal to detect a phase error between said intermediate frequency signal and the output signal of said oscillator and produce an error signal, and
    a loop filter coupled between said detecting means and said oscillator to couple said error signal to said oscillator for control thereof to provide a phase lock between the output signal of said oscillator and said intermediate frequency signal.

14. A circuit according to claim 13, wherein said first means is coupled to the output of said loop filter,
said second means is coupled to the input of said loop filter, and
said third means is coupled to the output of said detecting means.

15. A circuit according to claim 14, wherein said first means includes a fourth means coupled to the output of said loop filter to detect when said error signal achieves a predetermined direct current value.

16. A circuit according to claim 15, wherein said fourth means includes
    an operational amplifier circuit.

17. A circuit according to claim 15, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and the input of said loop filter, and
    a latch circuit coupled between first and third means and said switch circuit to control said switch circuit in response to said out-of-lock condition and said locked condition.

18. A circuit according to claim 17, wherein said tone generator provides a dither tone.

19. A circuit according to claim 18, wherein each of said tone generator, said sweep generator, said summing amplifier and said latch circuit includes
    at least one operational amplifier circuit.

20. A circuit according to claim 19, wherein said switch circuit includes
    a transistor switch.

21. A circuit according to claim 17, wherein said third means includes
    a bandpass filter and a tone detector coupled between the output of said detecting means and said latch circuit.

22. A circuit according to claim 14, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and the input of said loop filter, and
    a latch circuit coupled between said first and third means and said switch circuit to control said switch circuit in response to said out-of-lock condition and said locked condition.

23. A circuit according to claim 22, wherein said tone generator provides a dither tone.

24. A circuit according to claim 23, wherein each of said tone generator, said sweep generator, said summing amplifier and said latch circuit includes
    at least one operational amplifier circuit.

25. A circuit according to claim 24, wherein said switch circuit includes
    a transistor switch.

26. A circuit according to claim 22, wherein said third means includes
    a bandpass filter and a tone detector coupled between the output of said detecting means and said latch circuit.

27. A circuit according to claim 14, wherein said third means includes
    a bandpass filter and a tone detector coupled between the output of said detecting means and said latch circuit.

28. A circuit according to claim 14, wherein said loop filter includes
    a first operational amplifier circuit,
    said first means is coupled to the output of said first operational amplifier circuit, and
    said second means is coupled to an inverting input of said first operational amplifier circuit.

29. A circuit according to claim 28, wherein said first means includes
    a fourth means coupled to the output of said first operational amplifier circuit to detect when said error signal achieves a predetermined direct current value.

30. A circuit according to claim 29, wherein said fourth means includes
    a second operational amplifier circuit coupled to the output of said first operational amplifier circuit.

31. A circuit according to claim 29, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and said inverting input of said first operational amplifier circuit, and
    a latch circuit coupled between said fourth and third means and said switch circuit to control said switch circuit in response to said out-of-lock condition and said locked condition.

32. A circuit according to claim 31, wherein said tone generator provides a dither tone.

33. A circuit according to claim 31, wherein said switch circuit includes
    a transistor switch.

34. A circuit according to claim 31, wherein said third means includes
    a bandpass filter and a tone detector coupled between the output of said detecting means and said latch circuit.

35. A circuit according to claim 34, wherein said bandpass filter and said tone detector are included in a second operational amplifier circuit.

36. A circuit according to claim 28, wherein said second means includes
    a tone generator to provide said tone,
    a sweep generator to provide said sweep voltage,
    a summing amplifier coupled to said tone generator and said sweep generator to combine said tone and said sweep voltage,
    a switch circuit coupled between said summing amplifier and said inverting input of said first operational amplifier circuit, and
    a latch circuit coupled between said first and third means and said switch circuit to control said switch circuit in response to said out-of-lock condition and said locked condition.

37. A circuit according to claim 36, wherein said tone generator provides a dither tone.

38. A circuit according to claim 37, wherein said switch circuit includes
    a transistor switch.

39. A circuit according to claim 36, wherein said switch circuit includes
    a transistor switch.

40. A circuit according to claim 36, wherein said third means includes a bandpass filter and a tone detector coupled between the output of said detecting means and said latch circuit.

41. A circuit according to claim 28, wherein said third means includes a bandpass filter and a tone detector coupled between the output of said detecting means and said latch circuit.

* * * * *